May 5, 1970 D. R. HYER 3,510,792
ISOLATION AND GUARDING CIRCUIT FOR MINIMIZING DRIFT IN PROCESS CONTROL HOLDING AMPLIFIER
Filed June 28, 1967
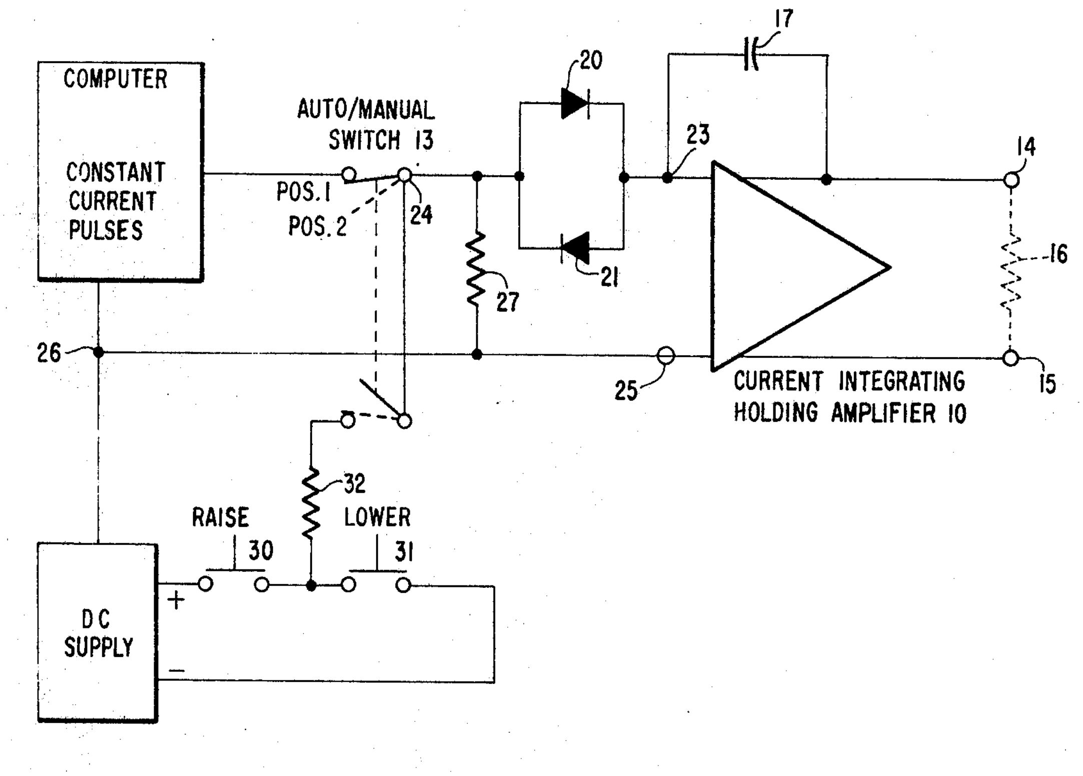
INVENTOR
DONALD R. HYER
BY George A. Herbster
ATTORNEY

United States Patent Office 3,510,792

Patented May 5, 1970

3,510,792

ISOLATION AND GUARDING CIRCUIT FOR MINIMIZING DRIFT IN PROCESS CONTROL HOLDING AMPLIFIER

Donald R. Hyer, Lynnfield, Mass., assignor to General Electric Company, a corporation of New York Filed June 28, 1967, Ser. No. 649,715

Int. Cl. H03f 1/28, 21/00

U.S. Cl. 330—51 4 Claims

ABSTRACT OF THE DISCLOSURE

A process controller isolating and guarding circuit. Back-to-back low leakage diodes in series with one high input impedance holding amplifier input terminal and a source of signals and a shunting resistance across the signal source block noise signals from the amplifier.

BACKGROUND OF THE INVENTION

This invention generally relates to process controller amplifiers and more particularly to an amplifier for direct digital control having improved stability.

When high input impedance holding amplifiers are utilized in process controllers especially adapted for direct digital control, the environment in which they are located can be critical to their drift characteristics. Normally, in a holding amplifier utilizing an FET (field effect transistor), the output is a function of either a direct digital pulse or a manually applied D-C signal. It is desired in such amplifiers to obtain a relatively drift-free output current from the amplifier for long periods of time.

Although drift-free results are attainable in controlled environments, in practical applications maintenance of such controlled environments is difficult. The use of external cables, terminal boards, switches and other components in the amplifier input circuit which are exposed to dirt and humidity can cause the introduction of extraneous low-level, or noise, signals in the input voltage and thereby produce drift of the amplifier output current. Hence, without a command to increase or decrease the holding amplifier output current from either the computer or the manual control means, it was possible for the amplifier output current to vary.

Therefore, it is an object of this invention to provide a holding amplifier for a process controller which has improved output drift characteristics.

Yet another object of this invention is to provide a holding amplifier for a process controller which is adapted to be located in a number of atmospheres or environments without adversely affecting the output stability of the amplifier.

SUMMARY

In accordance with one aspect of this invention, an input signal is coupled to a high input impedance holding amplifier through dual value impedance means having a high impedance to input signals below a certain value and low impedance to input signals above that value. Signals below the certain value represent noise and other unwanted signals and are therefore effectively blocked from reaching the input of the operational amplifier by shunting them from the holding amplifier.

This invention is pointed out with particularity in the appened claims. Other objects and advantages may be better understood by referring to the following description taken in conjunction with the accompanying drawing.

BRIEF DESCRIPTION OF THE DRAWING

The figure schematically illustrates a holding amplifier utilizing this invention.

DESCRIPTION OF THE PREFERRED EMBODIMENT

The figure shows a holding amplifier 10 which is adapted to be connected to either a computer 11 or a D-C supply 12 by switching means 13. The output of the holding amplifier 10 is connected to output terminals 14 and 15 adapted to be connected to a load 16 (shown in phantom), feedback for the operational amplifier 10 being provided by a capacitor 17. By using a holding amplifier including an FET integrating circuit, it has been possible to obtain a constant output current between the terminals 14 and 15 when no input is applied either from the computer 11 or the D-C supply 12 in controlled conditions.

However, as discussed above, in normally encountered environments the current between the terminals 14 and 15 may vary without any input from the computer 11 or the D-C supply 12. To overcome this problem, a pair of diodes 20 and 21, connected in reverse parallel relationship are inserted in the circuit between a first amplifier terminal 23 and a first controller terminal 24, a second amplifier input terminal 25 being directly coupled to a second controller input terminal 26. The switching means 13 provides selection between the computer 11 and the D-C supply 12 as shown by the positions of the switches in POSITION 1 and POSITION 2. A resistor 27 is connected between the controller input terminals 24 and 26, and this resistance has a value which is small in comparison with the D-C input resistance between the terminals 23 and 25. In the preferred embodiment, the amplifier input impedance is at least one order of magnitude greater than the resistance of the resistor 27.

In accordance with this invention, the computer 11 produces constant current pulses of a sufficient value to be conducted through either the diode 20 or the diode 21 to the amplifier input terminal 23 when the switching means 13 is in POSITION 1. Extraneous low-level, or noise, signals caused by contamination of the leads and switches by dirt and humidity in the environment normally produce voltages across the resistor 27 which are less than the forward breakdown voltage for the diodes 20 and 21. Therefore, if low leakage diodes are used, the diodes 20 and 21 appear as high impedances to the noise signals which are shunted through the resistor 27. However, the constant current pulses from the computer 11 are of such a value as to cause the diodes 20 and 21 to become conductive so that the computer pulses are conducted to the input of the amplifier to thereby vary the current at the output terminals 14 and 15. As the computer produces constant current pulses, the presence of noise during a pulse has a negligible effect on the circuit.

When the switching means 13 is shifted to POSITION 2, placing the amplifier in the manual mode, raising and lowering of the current at the output terminals 14 and 15 is accomplished by momentarily depressing a raise switch 30 or a lower switch 31 in series between the positive and negative outputs of the D-C supply 12. When the raise switch 30 is applied, a positive signal is applied to the controller input terminal 24 through a resistor 32 whereas a negative signal is applied when the lower switch 31 is depressed. The resistor 32 has a value which is sufficient to convert the D-C voltage to a current signal.

In a typical configuration, diodes 20 and 21 may be 2N3391's and the resistor 27 may have a value of 1 kilohm. Normally encountered inputs in FET amplifiers range in the order of several megohms and greater. As values of the leakage resistances in the circuit are very large in comparison with the value of the resistor 27, it will be seen that the voltage developed across the resistor 27 by noise signals will be relatively small.

It will be obvious to those of ordinary skill in the art that various modifications may be made to this circuit without departing from the true spirit and scope of this invention. The invention has been described in terms of an FET holding amplifier, but any process controller amplifier equivalent to this holding amplifier such as the amplifier described and claimed in Patent 3,315,236, issued Apr. 18, 1967 to C. W. Hewlett, Jr., and assigned to the same assignee as the present invention, may be substituted therefor while making appropriate changes in the circuit values.

In summary, this invention provides a holding amplifier with negligible drift by inserting dual value impedance means having a high impedance value below a certain voltage value and a low impedance above that value in series between one input of an operational amplifier and one input of a controller. Noise signals are isolated from the amplifier input so that only desired signals from a computer or D-C supply are coupled to the amplifier; unwanted signals are shunted through a low value resistance across the controller input terminals.

What is claimed as new and desired to be secured by Letters Patent of the United States is:

1. In a process controller responsive to current input signals including first and second controller input terminals and a high input impedance amplifier having first and second input terminals and first and second output terminals, said first input and first output terminals being shunted by capacitor means, so as to comprise a signal holding amplifier, the improvement of means for preventing the introduction of extraneous, low-level signals into said holding amplifier comprising:

(a) first resistance means connected between said first and second controller input terminals, the value of said first resistance means being at least one order of magnitude less than the input impedance of said amplifier;

(b) second impedance means in series between said first controller input terminal and said first amplifier input terminal, said second impedance means providing a high impedance to signals below a predetermined value corresponding to the maximum magnitude of said extraneous signals and a low impedance to signals above said predetermined value, said input signals having a magnitude above said predetermined value; and (c) means conductively connecting said second input terminals.

2. A process controller as recited in claim 1, said first resistance means being constituted by a resistor.

3. A process controller as recited in claim 1 wherein said second impedance means comprises a pair of low leakage diodes connected in inverse parallel relationship, said predetermined value being the forward breakdown voltage of said diodes.

4. A system for producing an analog output current adapted to be used as a set point signal in a process controller comprising:

(a) a high impedance holding amplifier having first and second input terminals and first and second output terminals, said output terminals adapted to be connected to opposite ends of a load;

(b) first terminal means adapted to be connected to a source of constant current pulses;

(c) second terminal means adapted to be connected to a current of selectable polarity;

(d) switching means for selectively connecting an input circuit to said first or second terminal means;

(e) resistance means connected between said switching means and said second input terminal of said amplifier, said amplifier input impedance being at least one order of magnitude greater than said resistance means; and (f) a pair of low leakage diodes, connected in inverse parallel relationship, in series between said first input terminal of said amplifier and said switching means.

References Cited

UNITED STATES PATENTS

| | | | |
|---|---|---|---|
| 3,079,566 | 2/1963 | Ebbinge | 330—20 |
| 3,188,577 | 6/1965 | Stoop | 330—16 X |
| 3,264,569 | 8/1966 | Lefferts | 330—9 |
| 3,392,345 | 7/1968 | Young | 330—51 |

NATHAN KAUFMAN, Primary Examiner

U.S. Cl. X.R.

330—24, 109, 183